United States Patent [19]

Hanna

[11] Patent Number: 5,051,628
[45] Date of Patent: Sep. 24, 1991

[54] INTEGRATED FILTER CIRCUIT

[75] Inventor: John E. Hanna, Mesa, Ariz.

[73] Assignee: Motorola, Inc., Tempe, Ariz.

[21] Appl. No.: 459,843

[22] Filed: Jan. 2, 1990

[51] Int. Cl.$^5$ .................... H03H 11/12; H03K 5/00
[52] U.S. Cl. ................................ 307/520; 307/521;
307/498; 307/355; 328/127; 328/167
[58] Field of Search ................... 307/520–521,
307/490, 494, 498, 355, 356, 231; 328/127, 167

[56] References Cited

U.S. PATENT DOCUMENTS

| | | | |
|---|---|---|---|
| 3,538,445 | 11/1968 | Brennen | 307/355 |
| 4,374,335 | 2/1983 | Fukahori et al. | 328/167 |
| 4,602,169 | 7/1986 | Shimizu | 307/355 |
| 4,644,196 | 2/1987 | Flannagan | 307/355 |
| 4,710,654 | 12/1987 | Saitoh et al. | 328/167 |
| 4,752,741 | 6/1988 | Kim et al. | 307/520 |
| 4,806,880 | 2/1989 | Laws | 328/167 |

*Primary Examiner*—Stanley D. Miller
*Assistant Examiner*—Hanh Nguyen

[57] ABSTRACT

An integrated filter having a controllable frequency response includes a pair of cascaded differential transconductance amplifiers with the differential outputs of the first one of the pair being coupled to the differential inputs of the second one via coupling resistors and the differential inputs of the first one being coupled to inputs of the filter via input coupling resistors. The differential outputs of the second transconductance amplifier are coupled both to outputs of the filter and are fed back to the respective differential inputs of the two amplifiers to provide multiple inputs such that the damping factor of the filter is controllable for adjusting the filter frequency transfer function by varying the ratio of the coupling resistor value to the feedback resistor value while the damping factor is independent of the natural resonant frequency of the filter. Series coupled integrating capacitors are coupled across the differential outputs of both pairs of amplifiers with the interconnection therebetween return to ground.

9 Claims, 2 Drawing Sheets

INTEGRATED FILTER CIRCUIT

BACKGROUND OF THE INVENTION

The present invention relates to filters and, more particularly, to filters suited to be realized in integrated circuit form which utilize differential transconductance amplifiers.

Prior art filters utilizing transconductance amplifiers of the type disclosed in U.S. Pat. No. 3,692,650 in which the gain is variable are known. These filters utilize transconductance amplifiers in a single ended configuration and generally include an integrating capacitor coupled across the output to thereby form a filter cell. By cascading filter cells a multiple filter can be derived which, for example, may be used to provide video signal filtering. For instance, a two-pole filter comprising a pair of single ended transconductance amplifiers connected in series is shown in Vol. CE-32, #3, Aug. '86, *IEEE Transaction On Consumer Electronics*. Feedback is provided from the output of the two-pole filter to the individual filter cells.

It is desirable to be able to control the damping factor of these type of filters in order to control the pass band and out of band cut-off of the filter among other characteristics thereof. This desirability is limited by the prior filters using single-ended configured transconductance amplifiers. In these types of filters, in order to change the damping factor, either the ratios of the gm of the amplifiers or the capacitor ratios of the integrating capacitors must be varied since the damping factor is a function thereof. In most prior art such filters the gm of each of the transconductance amplifiers are made equal to one another which means that to control the damping factor the ratios of the integrating capacitors must be varied. The problem faced in the prior art is that to obtain a damping factor significantly different from a value of one-half requires a large change in the ratio of the capacitors which may not be achievable if these types of filters are to be fabricated in integrated circuit form. Alternately, ratioing gm values tends to cause poor control over the ratios as gms are changed.

Hence, a need arises to be able to realize in integrated circuit form at least a two-pole filter which utilizes cascaded transconductance amplifier stages in which the damping factor can be controlled without requiring large values of capacitor ratios.

SUMMARY OF THE INVENTION

Accordingly, it is an object of the present invention to provide an improved integratable filter.

It is another object of the present invention to provide a differential integrating filter comprised of differential transconductance amplifier stages.

Still another object of the present invention is to provide a filter cell for a differential integrating filter.

In accordance with the above and other objects there is provided an integrated filter comprised of a pair of cascaded differential transconductance amplifiers with the differential outputs of the first one of the pair being coupled to the differential inputs of the second one via coupling resistors and the differential inputs of the first one being coupled to inputs of the filter via input coupling resistors. The differential outputs of the second transconductance amplifier are coupled both to outputs of the filter and are fed back to the differential inputs of the two amplifiers to provide multiple inputs such that the damping factor of the filter is controllable for adjusting the shape of the filter frequency transfer function by varying the ratio of the input resistor value to the feedback resistor value while the damping factor is independent of the natural resonant frequency of the filter.

DETAILED DESCRIPTION OF THE PREFERRED EMBODIMENT

Figure 1:
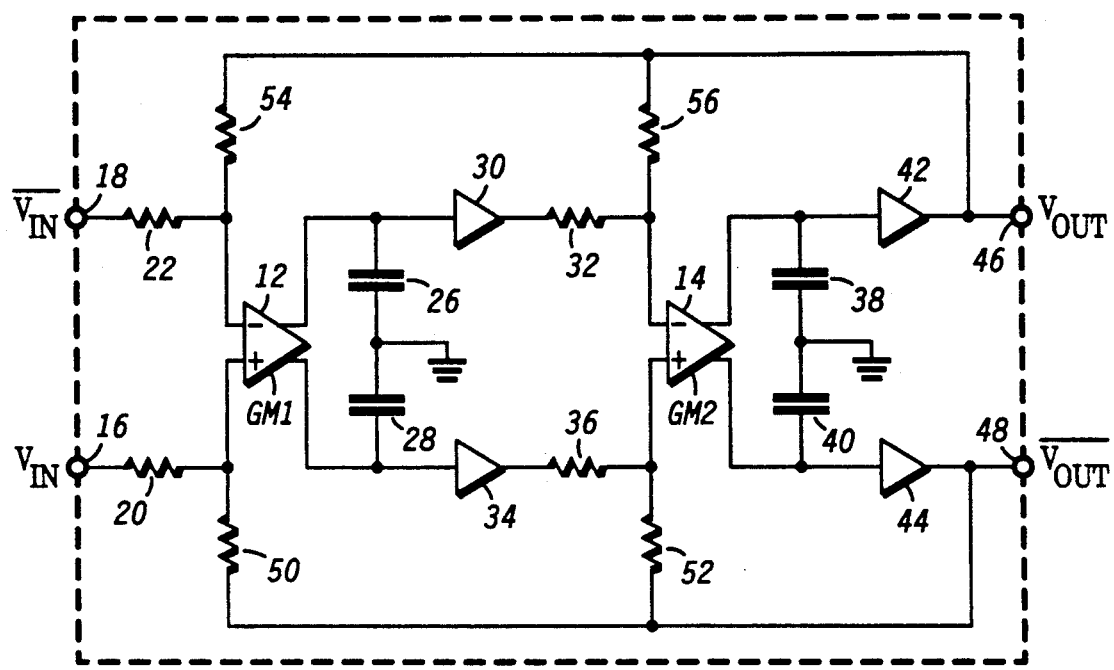
FIG. 1 is a partial schematic and block diagram illustrating a differential integrating filter of the present invention.

Turning to FIG. 1 there is shown a two-pole filter 10 of the present invention that uses cascaded differential transconductance amplifier stages 12 and 14 each of which form an individual filter cell as will be described in more detail hereinbelow. Filter 10 has a filter response, which as understood, has a natural resonance frequency ($\omega_n$) and a damping factor ($\zeta$) the latter of which controls the filter response. By controlling the magnitude of $\zeta$, the filter can be made to have a predetermined pass band and cut off frequency as is well understood. Filter 10 receives differential input voltage signals Vin and $\overline{\text{Vin}}$ at inputs 16 and 18 which are coupled via input resistors 20 and 22 to the non-inverting and inverting inputs respectively of transconductance amplifier 12. The integrating capacitor of the first filter cell comprised of amplifier 12 is formed by capacitors 26 and 28 which are series coupled across the outputs of amplifier 12 with the interconnection therebetween being coupled to ground reference. The complementary outputs of amplifier 12 are coupled to the respective differential inputs of transconductance amplifier 14 through buffer amplifiers 30 and 34 and input resistors 32 and 36. Similarly, a pair of series coupled capacitors 38 and 40 are coupled across the complementary outputs of amplifier 14 with the interconnection therebetween returned to ground. The outputs of amplifier 14 are also coupled to respective filter outputs 46 and 48 via buffer amplifiers 42 and 44. The outputs of filter 10 are fed back to the individual filter cells via feedback resistors 50, 52 and 54, 56. The transconductance amplifiers 12 and 14 have an associated transconductance $gm_1$ and $gm_2$.

In response to the applied input signals Vin and $\overline{\text{Vin}}$ output signals Vout and $\overline{\text{Vout}}$ are produced at outputs 46 and 48 according to the filter response which is a function of the resonant frequency and the damping factor of the filter. As will be discussed later, by using differential transconductance amplifiers with multiple inputs (via the input resistors and feedback resistors) to form filter 10, the two pole filter provides a frequency transfer function that can be varied. The frequency transfer function can be controlled by varying the natural resonant frequency and the damping factor.

Figure 2:
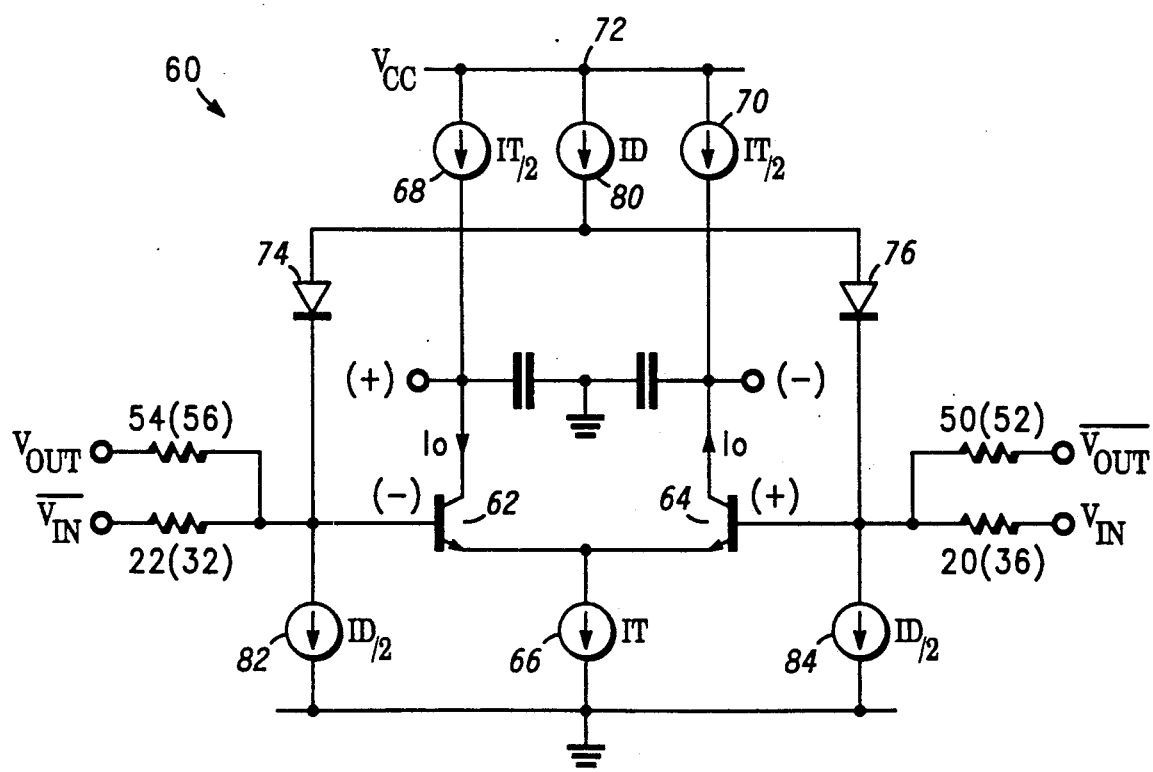
FIG. 2 is a schematic diagram illustrating a filter cell of the filter of FIG. 1.

Turning to FIG. 2, each filter cell of filter 10 is shown as including a wide band transconductance amplifier 60 comprised of differentially connected transistors 62 and 64 the emitters of which are coupled to current source 66 which sinks a tail current $I_T$. The base electrodes of the two transistors are coupled to the inverting and non-inverting inputs of the amplifier while the collectors coupled respectively to the complementary outputs of the amplifier and are returned to Vcc at 72 via current sources 68 and 70, each of which source a current equal to one-half $I_T$. Current supply 80 which sources a current $I_D$ is coupled between conductor 72 and the anodes of a pair of diodes 74 and 76, the cathodes of which are returned respectively to the base of transistor 62 and the base of transistor 64. Each diode 74 and 76 is coupled to a respective current supply 82 and 84 both of which sink a current that is one-half the current sourced by current supply 80, i.e., $I_D/2$. Multiple inputs to each amplifier 60 of the individual filter cells is provide through the associated input resistors 20, 22 or 32, 36 and associated feedback resistors 50, 54 or 52, 56.

Recalling that prior art filters using cascaded single ended transconductance amplifiers, the damping factor $\zeta$ can be shown to be a function of:

$$\sqrt{\frac{C1 gm2}{C2 gm1}} \qquad (1)$$

and that the natural resonant frequency is:

$$\omega_n = \sqrt{\frac{gm1 gm2}{C1 C2}} \qquad (2)$$

Thus, the filter transfer function can be varied controlling the damping factor; by adjusting either the ratios of the integrating capacitors C1, C2 or the ratios of the transconductance gm1, gm2. However, to get a damping factor greater than 1, the capacitor ratios required may not be suitable for manufacturing the filter in integrated circuit form. Furthermore, it is seen from equations 1 and 2 that the damping factor is not independent of the natural resonant frequency of the filter. Hence, if the damping factor is varied to control the filter response, the resonant frequency of the filter is also affected.

Referring back to FIGS. 1 and 2 and for simplification looking at feedback from the output of transconductance amplifier 14 to the input thereof the following equations can be derived. In general, the transconductance, gm, of the transconductance amplifiers is equal to:

$$gm = \frac{i_o}{Vin - Vo} \qquad (3)$$

where: $i_o$ is the collector current of the amplifier, Vin and Vo are the input and output voltages of the amplifier.

Rearranging equation 3 and writing the equation in the s frequency domain, the transconductances of amplifiers 12 and 14 can be shown to be equal to:

$$V_{01} = i_{01}\left(\frac{1}{sC1}\right) = gm1(Vin - V_{02})\left(\frac{1}{sC1}\right) \qquad (4)$$

and $$V_{02} = i_{02}\left(\frac{1}{sC2}\right) = gm2(V_{01} - K2V_{02})\left(\frac{1}{sC2}\right) \qquad (5)$$

where $V_{01}$ and $V_{02}$ are the output voltages appearing at the outputs of amplifiers 12 and respectively and $i_{01}$ and $i_{02}$ are the outputs currents, C1 and C2 are the equivalent integrating capacitors on the outputs of the two amplifiers; and K2 is the feedback factor.

Substituting equation 4 into equation 5 and rearranging yields:

$$V_{02} = (Vin)\left(\frac{s^2 C1 C2}{gm1 gm2} + \frac{s K2 C1}{gm1} + 1\right) \qquad (6)$$

Hence, from equation 6, the natural resonant frequency and damping factor of filter 10 of the present invention are:

$$\omega_n = \sqrt{\frac{gm1 gm2}{C1 C2}} \qquad (7)$$

and $$\zeta = \frac{K2}{2}\sqrt{\frac{gm2 C1}{gm1 C2}} \qquad (8)$$

Thus, for filter 10 of the present invention it is seen that the damping factor is controllable by the factor K2 and is independent of the natural resonant frequency of the filter. Therefore, the filter transfer function can be varied independent of the gm's of the individual filter cells and the ratios of the integrating capacitors. This is a great improvement over prior filter designs using single ended transconductance amplifiers.

Figure 3:
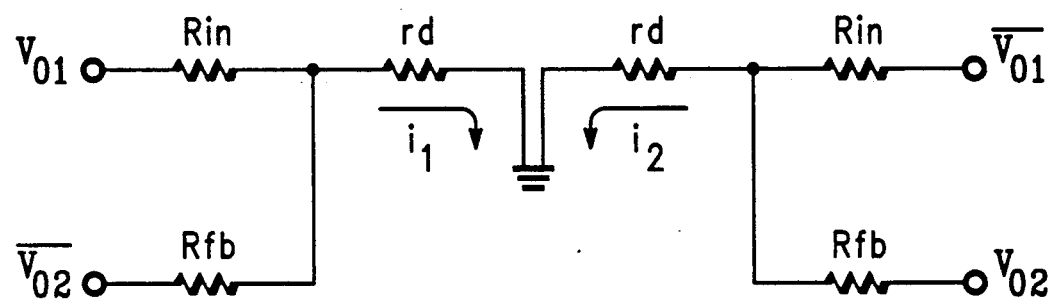
FIG. 3 is a simplified schematic diagram of the equivalent filter cell input circuit of the present invention.

Referring now to FIG. 3 there is shown the simplified equivalent circuit of the input of filter cell 60 wherein Rin are the input resistors to the inverting and non-inverting inputs of the transconductance amplifier and Rfb are the feedback resistors thereto and rd is equivalent resistance of diodes 74 and 76. The diode resistances are shown coupled from the inverting and non-inverting inputs and ground. This assumes that a virtual ground at the interconnection of the equivalent resistances of the diode due to the symmetry of the differential amplifier.

From FIG. 3:

$$i_1 = \frac{Vd}{rd} = \frac{V_{01} - Vd}{Rin} + \frac{\overline{V_{02}} - Vd}{Rfb} \qquad (9)$$

and $$i_2 = \frac{\overline{Vd}}{rd} = \frac{\overline{V_{01}} - \overline{Vd}}{Rin} + \frac{V_{02} - \overline{Vd}}{Rfb} \qquad (10)$$

Assuming that Rin and Rfb >>> rd, and solving equations 9 and 10 for $i_1$ and $i_2$ gives:

$$i_1 = \frac{V_{01}}{Rin} + \frac{\overline{V_{02}}}{Rfb} \qquad (11)$$

and $$i_2 = \frac{\overline{V_{01}}}{Rin} + \frac{V_{02}}{Rfb} \qquad (12)$$

The actual current gain of the transconductance amplifier can be defined as the average of the diode currents times the gain factor $I_T/I_D$ or:

$$i_0 = \frac{i_1 + (-i_2)}{2}\left(\frac{I_T}{I_D}\right) \quad (13)$$

Hence:

$$i_0 = \left[\frac{V_{01}}{Rin} - \frac{V_{02}}{Rfb}\right]\left(\frac{I_T}{I_D}\right) \quad (14)$$

As $i_0$ equals the output current from the amplifier, $i_0$ and $i_{02}$ can be equated which gives:

$$gm2(V_{01} - K2V_{02}) = \left[\frac{V_{01}}{Rin} - \frac{V_{02}}{Rfb}\right]\left(\frac{I_T}{I_D}\right) \quad (15)$$

or $$gm2\, V_{01} = \frac{V_{01}}{Rin}\left(\frac{I_T}{I_D}\right) \quad (16)$$

and $$K2gm2V_{02} = \frac{V_{02}}{Rfb}\left(\frac{I_T}{I_D}\right) \quad (17)$$

from equations 16 and 17 it follows that:

$$K2 = \frac{Rin}{Rfb}. \quad (18)$$

Hence the damping factor, which controls the filter transfer function of filter 10, can be controlled by adjusting the resistor ratios of the input resistors and the feedback resistors.

Hence, what has been described above is a novel filter using cascaded differentially operated transconductance amplifiers in which multiple inputs (Rin and Rfb) are provided to form a filter capable of providing a frequency transfer function with one or more poles. The natural resonant frequency is tunable by varying the current setting the transconductances of the amplifiers of the filter cells and the damping factor is independent of the natural resonant frequency and can be adjusted by varying the ratios of the amplifiers as well as the resistor ratios of the input and feedback resistors. Moreover, since all the capacity sensitive nodes are at virtual ground and since the interconnection of transconductance controlling diodes is at virtual ground the current supply sourcing current thereto is not critical. As a result, the frequency response of the filter is improved over prior art filters using transconductance amplifiers in a single-ended configuration.

What is claimed is:

1. An integrated filter including a pair of cascaded transconductance amplifiers wherein the improvement comprises:
    the pair of cascaded amplifiers being operated in a differential mode and each having first and second inputs and outputs;
    first and second resistors coupled respectively between first and second inputs of the filter and said first and second inputs of the first one of the pair of amplifiers;
    first integrating means coupled between said first and second outputs of said first one of said pair of amplifiers;
    third and fourth resistors coupled respectively between said first and second outputs of said first one of the pair of amplifiers and said first and second inputs of the second one of said pair of amplifiers;
    second integrating means coupled between said first and second outputs of said second one of the pair of amplifiers and said first and second outputs being coupled respectively to first and second outputs of the filter;
    a first feedback circuit coupled between said first output of the filter and said first inputs of the pair of amplifiers; and
    a second feedback circuit coupled between said second output of the filter and said second inputs of the pair of amplifiers.

2. The filter of claim 1 including:
    a first buffer amplifier means coupled between said first output of said first one of the pair of amplifiers and said third resistor;
    a second buffer amplifier means coupled between said second output of said first one of the pair of amplifiers and said fourth resistor;
    a third buffer amplifier means coupled between said first output of said second one of the pair of amplifiers and said first output of the filter; and
    a fourth buffer amplifier means coupled between said second output of said second one of the pair of amplifiers and said second filter output.

3. The filter of claim 2 wherein said first feedback circuit includes fifth and sixth resistors coupled from said first output of the filter to said first inputs respectively of the pair of amplifiers.

4. The filter of claim 3 wherein said second feedback circuit includes seventh and eighth resistors coupled from said second output of the filter to said second inputs respectively of the pair of amplifiers.

5. The filter of claim 4 wherein each one of the pair of amplifiers comprises:
    first and second transistors each having a base of the first transistor being coupled to said first input of the respective amplifier, and said base of said second transistor being coupled to said second input of the respective amplifier, and said collectors being coupled respectively to said first and second outputs of the respective amplifier;
    first current supply means for sourcing currents of predetermined magnitude to said collectors of said first and second transistors;
    third current supply means for providing a current of predetermined magnitude; and
    diode means coupled between said third current supply means and the respective first and second inputs of the amplifiers.

6. A filter cell for use in an integrated filter, said filter cell comprising:
    a transconductance amplifier having first and second differential inputs and outputs, said first and second differential outputs being coupled to first and second outputs of the filter cell respectively;
    a first resistor coupled between said first differential input and a first input of the filter cell;
    a second resistor coupled between said second differential input and a second input of the cell; and
    integrating capacitive means coupled between said first and second differential outputs.

7. The filter cell of claim 6 wherein said transconductance amplifier includes:
   first and second transistors each having a base, emitter and a collector, said emitters being interconnected, said collectors being coupled respectively to said first and second outputs of said amplifier and said bases being coupled respectively to said first and second inputs of said amplifier;
   first current supply means coupled to said collectors for providing currents of predetermined magnitude thereto; and
   second current supply means coupled to said interconnected emitters for sinking a current of predetermined magnitude.

8. The filter cell of claim 7 wherein said transconductance amplifier further includes:
   a first diode coupled between a circuit node and said first input of said amplifier;
   a second diode coupled between said circuit node and said second input of said amplifier; and
   third current supply means for sourcing current of predetermined magnitude to said first circuit node.

9. An integrated filter having a controllable filter transfer function and having first and second inputs and outputs, comprising:
   first and second differential transconductance amplifiers each having first and second differential inputs and outputs;
   a first resistive means for coupling the first and second inputs of the filter to said first and second differential inputs of said first transconductance amplifier respectively;
   first and second integrating capacitive means coupled respectively between said first and second differential outputs of said first and second differential transconductance amplifiers;
   resistive circuit means for coupling said first and second differential outputs of said first transconductance amplifier to said first and second differential inputs of said second transconductance amplifier;
   circuit means for coupling said first and second differential outputs of said second transconductance amplifier to said first and second outputs of the filter; and
   resistive feedback means for coupling said first and second differential outputs of said second transconductance amplifier to said first and second differential inputs thereof respectively.

* * * * *